(12) United States Patent
Fishburn et al.

(10) Patent No.: US 7,501,672 B2
(45) Date of Patent: Mar. 10, 2009

(54) METHOD AND STRUCTURE FOR A SELF-ALIGNED SILICIDED WORD LINE AND POLYSILICON PLUG DURING THE FORMATION OF A SEMICONDUCTOR DEVICE

(75) Inventors: Fredrick D. Fishburn, Boise, ID (US); Terrence B. McDaniel, Boise, ID (US); Richard H. Lane, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 56 days.

(21) Appl. No.: 11/545,163

(22) Filed: Oct. 10, 2006

(65) Prior Publication Data

US 2007/0164350 A1    Jul. 19, 2007

Related U.S. Application Data

(62) Division of application No. 10/619,052, filed on Jul. 10, 2003, now Pat. No. 7,119,024.

(51) Int. Cl.
*H01L 29/417* (2006.01)

(52) U.S. Cl. .................. 257/249; 257/213; 257/202; 257/E29.116

(58) Field of Classification Search ............. 257/202, 257/213, 249, E29.116
See application file for complete search history.

(56) References Cited

U.S. PATENT DOCUMENTS

| | | | |
|---|---|---|---|
| 5,198,384 A | 3/1993 | Dennison | 437/47 |
| 5,381,302 A | 1/1995 | Sandhu et al. | 361/305 |
| 5,422,296 A | 6/1995 | Lage | 437/52 |
| 5,536,683 A | 7/1996 | Lin et al. | 437/200 |
| 5,627,093 A | 5/1997 | Hachisuka et al. | 438/649 |
| 5,854,127 A | 12/1998 | Pan | 438/629 |
| 5,899,742 A | 5/1999 | Sun | 438/682 |
| 5,998,257 A | 12/1999 | Lane et al. | 438/253 |
| 6,013,547 A | 1/2000 | Liaw | 438/238 |
| 6,074,960 A | 6/2000 | Lee et al. | 438/749 |
| 6,096,638 A | 8/2000 | Matsubara | 438/649 |
| 6,175,146 B1 | 1/2001 | Lane et al. | 257/635 |
| 6,184,129 B1 * | 2/2001 | Hwang et al. | 438/653 |
| 6,194,315 B1 | 2/2001 | Hu et al. | 438/683 |
| 6,261,899 B1 | 7/2001 | Lane et al. | 438/253 |
| 6,383,863 B1 | 5/2002 | Chiang et al. | 438/241 |
| 6,486,060 B2 | 11/2002 | Hermes et al. | 438/649 |
| 6,627,913 B2 * | 9/2003 | Chen | 257/10 |
| 6,635,536 B2 | 10/2003 | Shin et al. | 438/276 |
| 6,977,418 B2 * | 12/2005 | Hermes et al. | 257/342 |
| 7,119,024 B2 | 10/2006 | Fishburn et al. | 438/720 |

* cited by examiner

*Primary Examiner*—Victor A Mandala

(57) ABSTRACT

A method used to form a semiconductor device provides a silicide layer on a plurality of transistor word lines and on a plurality of conductive plugs. In one embodiment, the word lines, one or more sacrificial dielectric layers on the word lines, conductive plugs, and a conductive enhancement layer are formed through the use of a single mask. An in-process semiconductor device which may be formed using one embodiment of the inventive method is also described.

20 Claims, 8 Drawing Sheets

METHOD AND STRUCTURE FOR A SELF-ALIGNED SILICIDED WORD LINE AND POLYSILICON PLUG DURING THE FORMATION OF A SEMICONDUCTOR DEVICE

This is a division of U.S. Ser. No. 10/619,052 filed Jul. 10, 2003 and issued Oct. 10, 2006 as U.S. Pat. No. 7,119,024.

FIELD OF THE INVENTION

This invention relates to the field of semiconductor manufacture, and more particularly to a process for forming self-aligned conductive structures having enhanced conductivity through an enhancement layer, and an inventive structure resulting from the process.

BACKGROUND OF THE INVENTION

Structures such as polycrystalline silicon (polysilicon) plugs, interconnects, and transistor gates are commonly formed during the manufacture of semiconductor devices such as microprocessors, memory devices, and logic devices. To manufacture a plug, for example, a masked dielectric layer is formed over an underlying substrate assembly and an etch is completed to form a hole in the dielectric which exposes the underlying structure in the area where contact is to be made. A blanket polysilicon layer is deposited over the dielectric layer which fills the hole in the dielectric layer and contacts the underlying structure. The polysilicon is then removed from a planar surface of the dielectric, typically using mechanical polishing such as a chemical mechanical polishing (CMP) process which leaves the plug formed within the dielectric layer. Interconnects and gates are typically formed by depositing a blanket layer of polysilicon over a semiconductor substrate assembly, then masking and etching the layer.

As the sizes of the plugs and line widths decrease with improved manufacturing technology, the doped polysilicon structure may provide insufficient conductance and excessive resistance. To reduce the resistance of a structure, a silicide layer is often formed underneath the plug or over the top of the plug, gate or interconnect. To form the silicide layer to enhance plug conductivity the silicide layer may be formed before formation of the plug. A titanium chemical vapor deposition (CVD) process results in titanium reacting with the exposed silicon wafer to form titanium silicide. An unreacted titanium metal layer will also form over any exposed dielectric layer which is then stripped. After stripping the unreacted titanium, the polysilicon plugs are formed over the silicide layer as described above.

A silicide layer may also be formed over the plug, transistor gate or other interconnect after forming the blanket polysilicon layer which forms the gate or interconnect. During a titanium CVD process similar to that described above for forming silicide under the plug, the titanium reacts with the polysilicon to form silicide on top of the polysilicon layer, then the polysilicon is masked and etched to define the line or plug.

While the silicide layer interposed between the silicon wafer and the polysilicon plug provides decreased resistance and increased conductance, it may also provide a path for leakage between an adjacent transistor channel region and an active area, thereby increasing junction leakage.

The following U.S. patents, each assigned to Micron Technology, Inc. and incorporated herein by reference as if set forth in their entirety, describe various processes for forming silicide layers: U.S. Pat. No. 5,381,302 by Sandhu et al.; Pat. No. 5,198,384 by Dennison; Pat. No. 6,074,960 by Lee, et al.; Pat. No. 6,194,315 by Hu, et al.; and Pat. No. 6,486,060 by Hermes, et al.

In particular, U.S. Pat. No. 6,486,060 discloses a process for forming a self-aligned titanium suicide layer over a plurality of polysilicon features, including conductive plugs and transistor gates (word lines). While the titanium silicide layer itself is self-aligned, a patterned dielectric layer which defines the subsequently formed titanium silicide layer over transistor gates is not self-aligned to the locations on which the titanium silicide is to be formed. As feature sizes decrease, it becomes increasingly desirable to provide structures which are completely self-aligned with other structures where possible to decrease product loss which may result from misaligned mask layers and to decrease other costs associated with providing patterned masks. Further, titanium silicide becomes more difficult to scale as feature sizes decrease.

A process and structure which provides improved conductance and reduced resistance and which does not increase junction leakage would be desirable. It would be further useful to provide a plug having a maximized amount of silicide formed thereon. Additionally, it would be advantageous to have a process with which the silicide, as well as any layers required to form the silicide, is self-aligned to various polysilicon features and scaleable with decreasing features sizes.

SUMMARY OF THE INVENTION

The present invention provides a new method and structure which, among other advantages, reduces problems associated with the manufacture of semiconductor devices, particularly problems resulting from the formation of a mask during a process which provides a silicide layer over various polysilicon features. An embodiment of the invention further provides an advantage of the formation of a silicide layer which is more scaleable with decreasing features sizes than previous silicide layers.

In accordance with one embodiment of the invention, a semiconductor wafer substrate assembly is provided which comprises a semiconductor wafer, a blanket transistor gate (word line) layer of polysilicon, blanket dielectric layers overlying the blanket transistor gate layer which may be removed selective to polysilicon and to a spacer layer, and a patterned mask layer which will define the transistor gates. Subsequently, the transistor gate layer and the dielectric layer overlying the gate layer are etched with a single mask pattern to define a plurality of transistor gates. Dielectric spacers are then formed alongside and contacting the transistor gate and overlying dielectric layers. A blanket polysilicon layer is then formed and planarized to provide a plurality of self-aligned plugs. Subsequently, the dielectric layers over the polysilicon gate layer are removed to expose the transistor gates (word lines), which also exposes a surface of the spacers. A blanket metal layer is formed over the surface of the structure, which includes forming the layer on the polysilicon plugs and gates, and on the exposed portions of the spacers. The metal which contacts the polysilicon material of the gates and plugs is converted to metal silicide, while the metal contacting the dielectric features is not converted. Finally, the unconverted metal is removed using an etch which is selective to the metal silicide (i.e. removes the metal while removing none or very little of the metal silicide) and wafer processing continues to form a semiconductor device.

Additional advantages will become apparent to those skilled in the art from the following detailed description read in conjunction with the appended claims and the drawings attached hereto.

BRIEF DESCRIPTION OF THE DRAWINGS

FIGS. 1-9 are cross sections.

It should be emphasized that the drawings herein may not be to exact scale and are schematic representations. The drawings are not intended to portray the specific parameters, materials, particular uses, or the structural details of the invention, which may be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been performed to provide regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
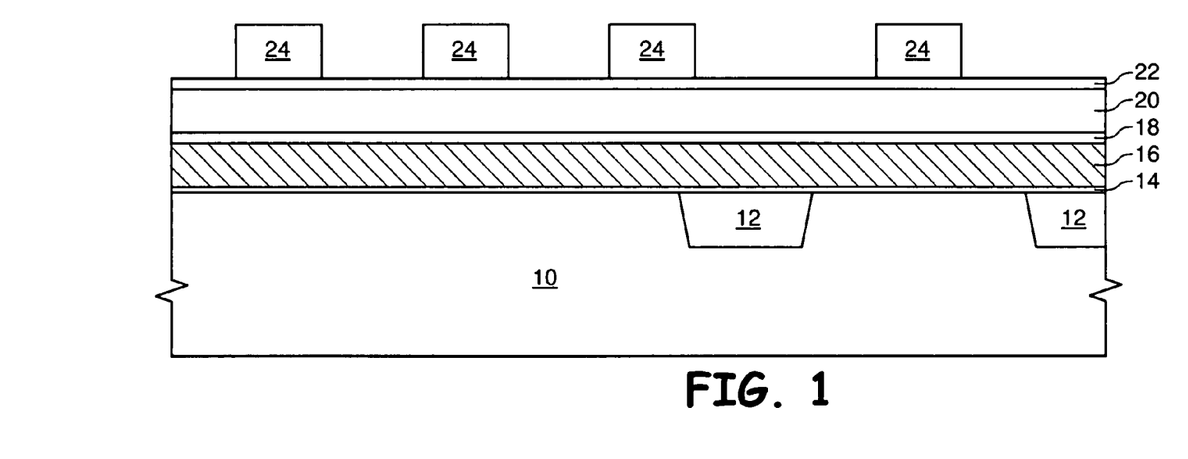

A first embodiment of an inventive method to provide an enhancement layer, for example silicide, which increases conductivity of another less conductive layer, for example polysilicon, over a plurality of features is depicted in FIGS. 1-10. FIG. 1 depicts the following structures: single crystal silicon semiconductor wafer 10; shallow trench isolation (STI) oxide 12; gate oxide layer 14; polysilicon transistor gate (word line) layer 16 about 1,000 angstroms (Å) thick; tetraethyl orthosilicate (TEOS) dielectric buffer layer 18 about 100 Å thick; silicon nitride ($Si_3N_4$) gate capping layer 20 about 1,000 Å (1 KÅ) thick; TEOS top capping layer 22 about 200 Å thick; and patterned photoresist layer 24. These layers may be formed by one of ordinary skill in the art from the description herein. One function of buffer layer 18 is to ensure that polysilicon 16 is not damaged during the formation of $Si_3N_4$ layer 20.

It should be noted that the materials and thicknesses specified herein are exemplary for a specific embodiment, and other materials and thickness would be evident to one of ordinary skill in the art from this description. Further, other structures such as STI nitride and doped N-wells and P-wells within the wafer will likely be present and evident to one of ordinary skill in the art, but are not depicted for simplicity of explanation.

After forming the FIG. 1 structure, a vertical (anisotropic) etch is performed within an etch chamber using the resist 24 as a pattern to define the transistor gates from polysilicon layer 16. The etch stops on (or within) gate oxide 14. An etchant which would remove each of layers 16-22 includes flowing $CF_4$, $CH_2F_2$, $NF_3$, $Cl_2$, HBr, or $HeO_2$ at a flow rate of between about 20 standard cubic centimeters per minute (sccm) and about 75 sccm. During the etch the wafer is maintained at a temperature of between about 60° C. and about 70° C., and the pressure within the etch chamber is maintained to between about 5 millitorr and about 60 millitorr, and the power is maintained to between about 150 Watts and about 1,000 Watts. Using these settings, TEOS layers 22, 18 and silicon nitride layer 20 are each etched at a rate of between about 30 Å/sec and about 40 Å/sec, and polysilicon layer 16 is etched at a rate of between about 10 Å/sec and about 30 Å/sec.

Figure 2:
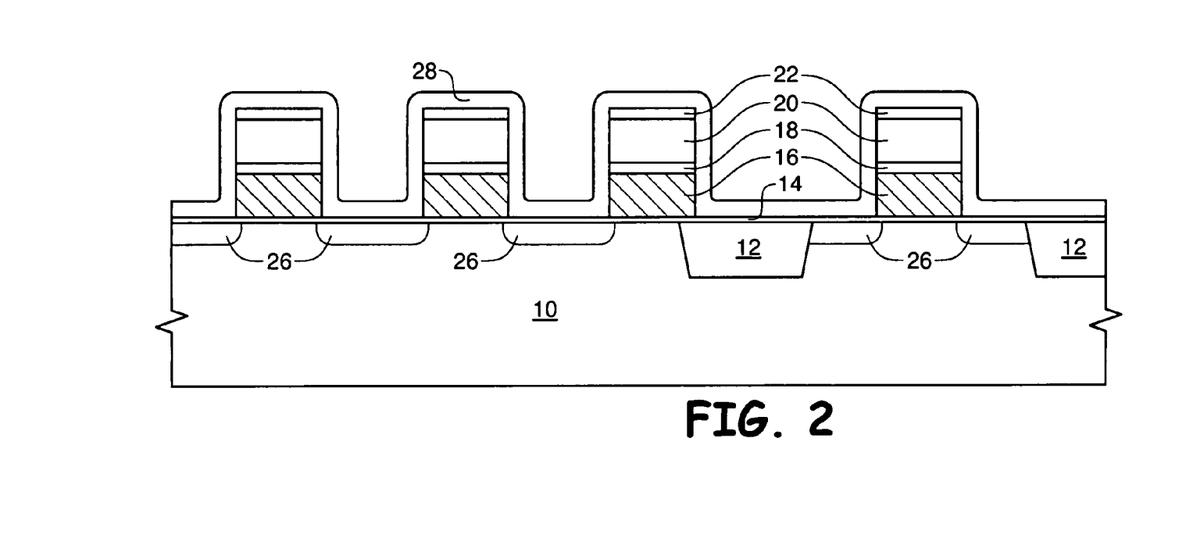

After etching the transistor gate stack, any necessary wafer doping is performed, for example to form source/drain (active area) regions 26, then a spacer layer 28, for example a conformal layer of silicon nitride, is formed as depicted in FIG. 2. A silicon nitride layer between about 20 Å and about 500 Å thick would be sufficient, and is easily manufactured by one of ordinary skill in the art.

After forming the FIG. 2 structure, a vertical spacer etch is performed, for example using $O_2$ and $CH_2F_2$ at a total flow rate of between about 10 sccm and about 40 sccm for a duration of between about 10 seconds and about 40 seconds. This etch is highly selective to silicon dioxide, such as layers 22 and 14, and highly anisotropic such that silicon nitride layer 20 is not substantially etched laterally. Once the nitride is removed from horizontal surfaces, the etch stops on top capping layer 22 and gate oxide 14. Subsequent to forming the spacers, any exposed gate oxide remaining over the wafer surface is cleared to expose the wafer surface between the transistor gates to result in the structure of FIG. 3 including spacers 30. During the etch of the gate oxide 14, a portion of oxide top capping layer 22 is also removed, but as it is thicker than gate oxide 14 at least a portion of layer 22 remains.

Figure 3:
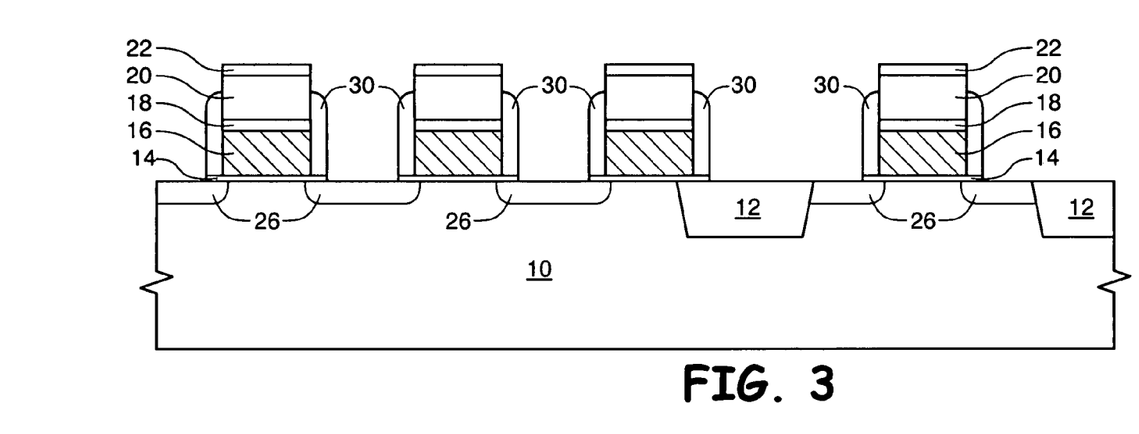
Figure 4:
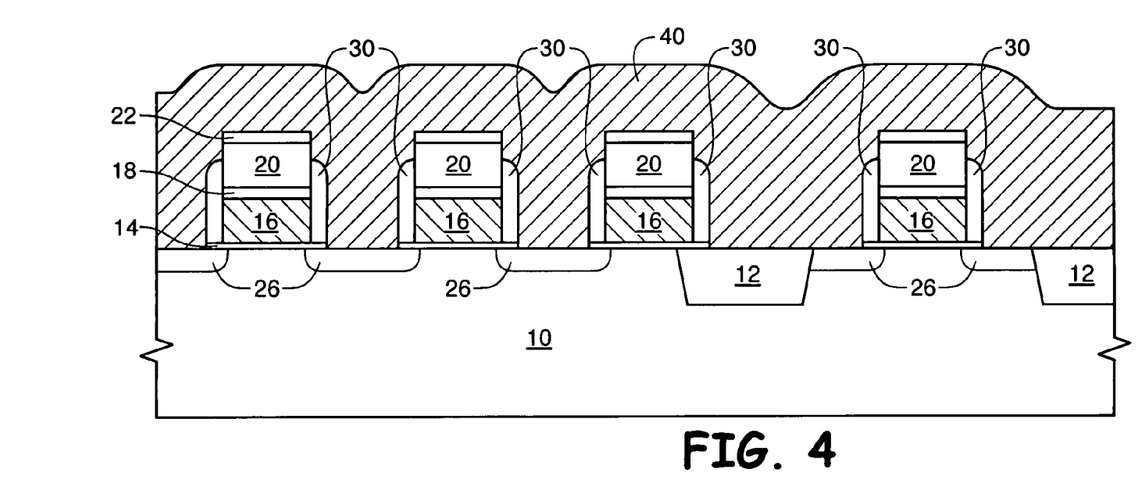

Next, a blanket polysilicon layer 40 is formed over the FIG. 3 structure to result in the structure of FIG. 4. As known in the art, layer 40 must be formed at least half as thick as the widest distance between adjacent features to ensure the spaces between all features are completely filled. In this exemplary embodiment, a polysilicon layer 40 between about 500 Å and about 4,000 Å is formed. Subsequently, the polysilicon layer 40, the top capping layer 22, and, possibly, a portion of silicon nitride gate capping layer 20 are planarized to result in the FIG. 5 structure comprising polysilicon plugs 50 which contact source/drain regions 26. The FIG. 4 structure may be planarized using a mechanical polishing process, for example a chemical mechanical polishing (CMP) process, as known in the art.

Figure 5:
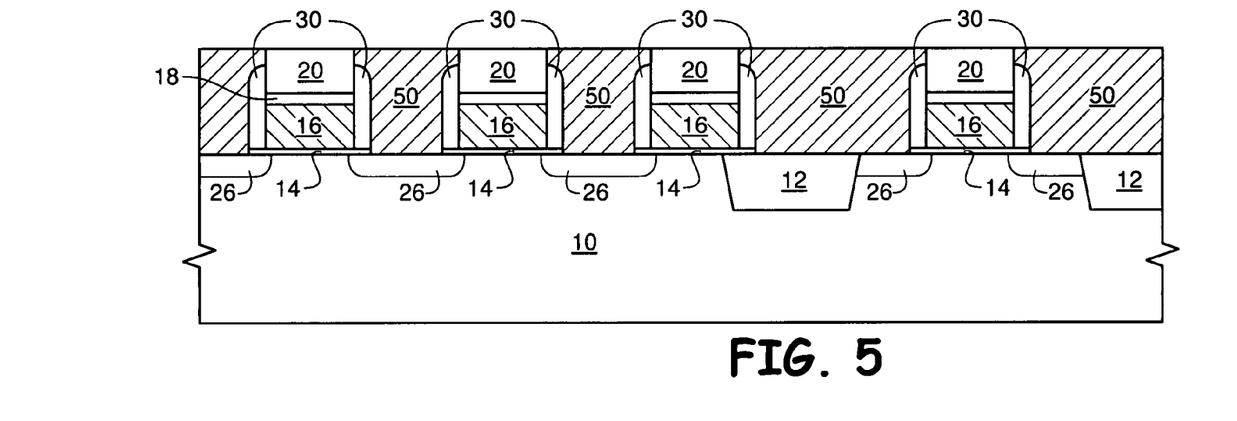

The structure of FIG. 5 is subjected to a vertical anisotropic etch to remove gate capping layer 20 and buffer layer 18, which exposes polysilicon 16. An anisotropic etch is used to remove silicon nitride capping layer 20 because nitride spacers 30 are exposed during the etch and it is desirable to leave nitride spacers 30 unetched. Alternately, spacers 30 may be formed from another material, such as TEOS or aluminum oxide ($Al_2O_3$), which allows layers 20 and 18 to be etched selective to spacers 30.

Oxide such as BPSG may be exposed at other wafer locations not depicted in the FIGS., and may be etched during the etch of buffer layer 18. However, the thickness of layer 18 is very thin relative to any BPSG or other oxide at other wafer locations, and the etch of layer 18 will not significantly impact the thickness of oxide exposed at other locations. In the alternative, any regions to be protected can be masked.

Figure 6:
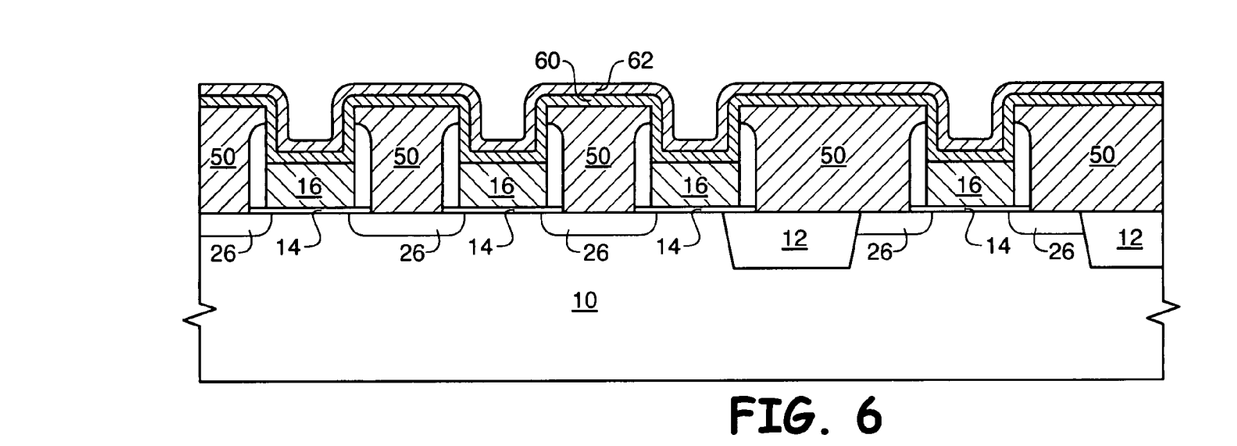
Figure 7:
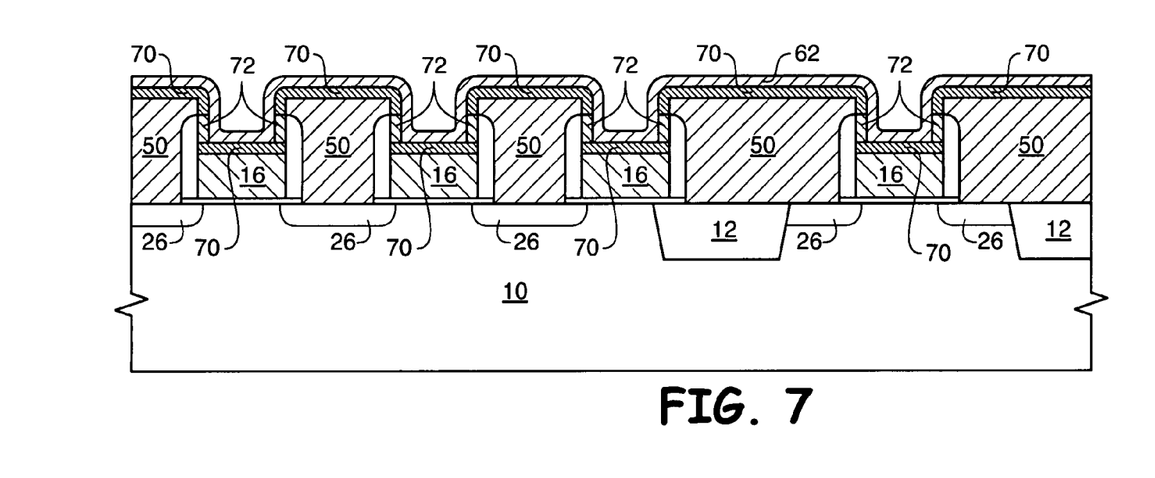

After exposing transistor gates 16 of FIG. 5 by removing capping layer 20 and buffer layer 18, a thin blanket metal layer 60 is formed to contact polysilicon 16 and polysilicon 50, and an optional protective layer 62, for example a metal nitride, is formed on metal layer 60 to result in the FIG. 6 structure. Layer 60 may comprises any metal which will combine with silicon to form metal silicide when in contact with polysilicon 50, 16. Particularly preferred metals include cobalt and nickel, as these metals and their silicides are eminently scaleable with the present process as device feature sizes decrease. A physical vapor deposition (PVD) cobalt or nickel layer between about 5 Å and about 1,000 Å, and more preferably between about 10 Å and about 500 Å may be formed by sputtering cobalt or nickel from a cobalt or nickel target onto a wafer in a PVD chamber at a temperature of between about 25° C. and about 85° C. for a duration of between about one second and about 200 seconds. At these temperatures, the selected metal will spontaneously combine with polysilicon 50, 16 into cobalt silicide or nickel silicide. Other workable metals for the present process include titanium and tungsten. After forming metal layer 60, layer 62, such as metal nitride or titanium, may be formed using a CVD or PVD. If used, layer 62 will protect the silicide from exposure to, and possible reaction with, oxygen. Such combination with oxygen will result in a silicide layer having increased resistance, and is therefore to be avoided.

After forming layers 60 and, optionally, 62, the structure of FIG. 6 is annealed, for example using a two-step treatment process. During the first step the FIG. 6 structure, and more particularly polysilicon 16 and metal layer 60, is heated to a temperature of between about 300° C. and about 900° C., and more preferably between about 400° C. and about 700° C., for between about one second to about 10 minutes, and more preferably for between about three seconds and about 60 seconds. During the second step the FIG. 6 structure is heated for between about 6 seconds and about 10 minutes to a temperatures of between about 400° C. and about 1,000° C., and more particularly to between about 200° C. and about 900° C. As previously stated, layer 62 protects the metal silicide from exposure to, and possible reaction with, oxygen, especially during the anneal. Annealing the FIG. 6 structure ensures that all metal which contacts polysilicon is combined with the polysilicon and is converted to metal silicide. This anneal step and the resulting conversion of metal and polysilicon to metal silicide further decreases the resistance of conductive structures formed by polysilicon 50, 16 and silicide 70 which contacts polysilicon 50, 16. After this anneal step, the structure of FIG. 7 results and comprises metal silicide 70 and unconverted metal 72.

Next, the protective layer 62 and unconverted metal 72 are removed, for example using a solution of ammonium hydroxide ($NH_4OH$), hydrogen peroxide ($H_2O_2$), and water (referred to as "APM"), or a solution of hydrochloric acid (HCl), hydrogen peroxide, and water (referred to as "HPM"). The remaining reacted film is temperature treated a second time by exposure to a temperature of between about 700° C. and about 1,000° C. for between about 1 second and about 100 seconds to form a low resistance silicide.

Figure 8:
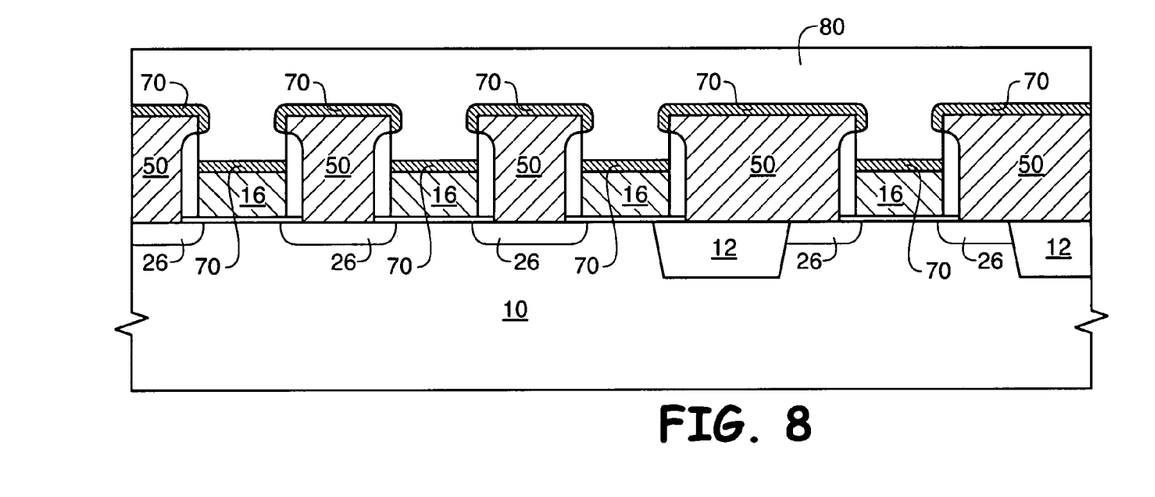
Figure 9:
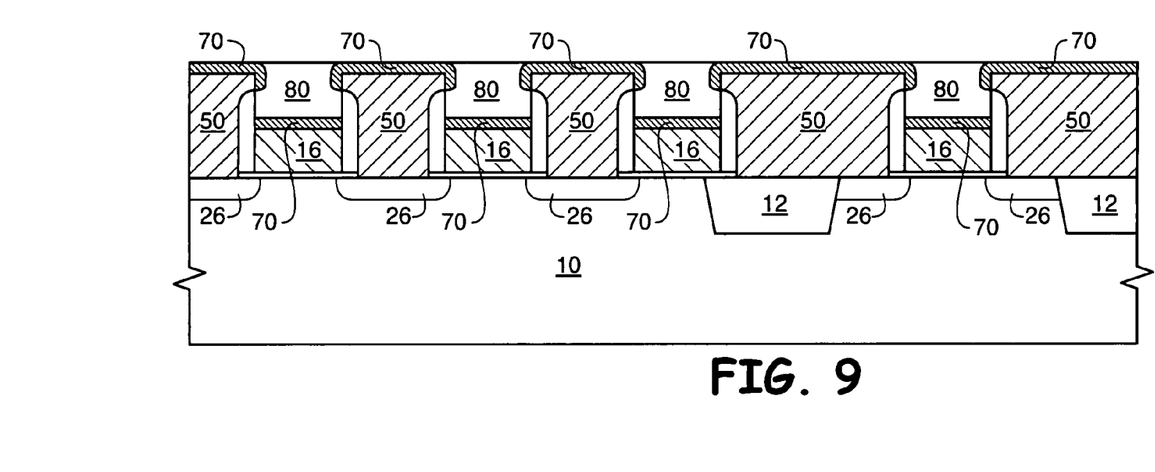
Figure 10:
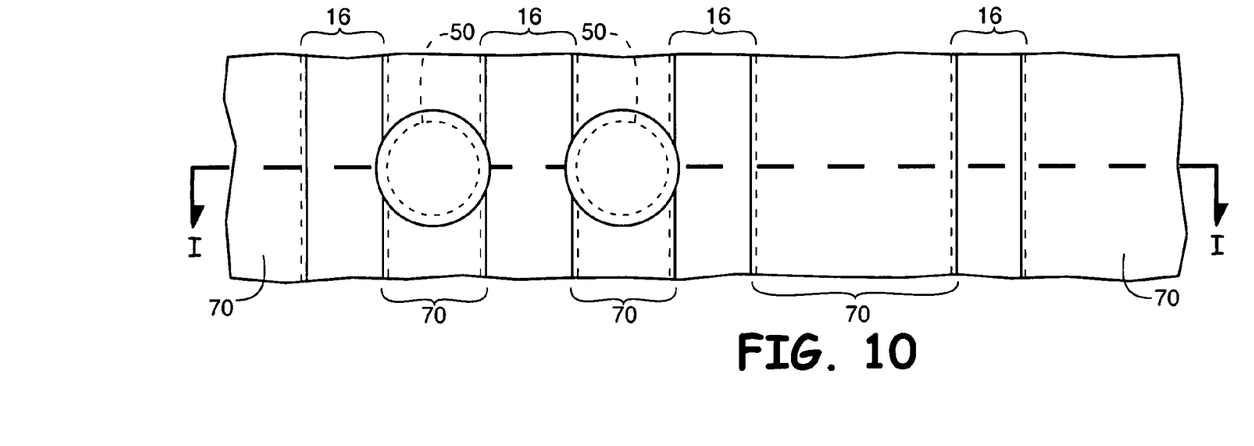
FIG. 10 is a plan view of FIG. 9, depicting intermediate structures during the formation of a semiconductor device using one embodiment of the present invention.

Subsequently, a dielectric layer 80, such as a spun-on borophosphosilicate glass layer is formed over the wafer surface as depicted in FIG. 8. After forming dielectric layer 80 of FIG. 8 it may be patterned and etched to expose silicide 70 covering plugs 50, or it may be planarized using mechanical planarization such as chemical mechanical planarization (CMP) to result in the structure of FIG. 9, depicted as I-I in the plan view of FIG. 10. Wafer processing then continues to form a semiconductor device.

Figure 11:
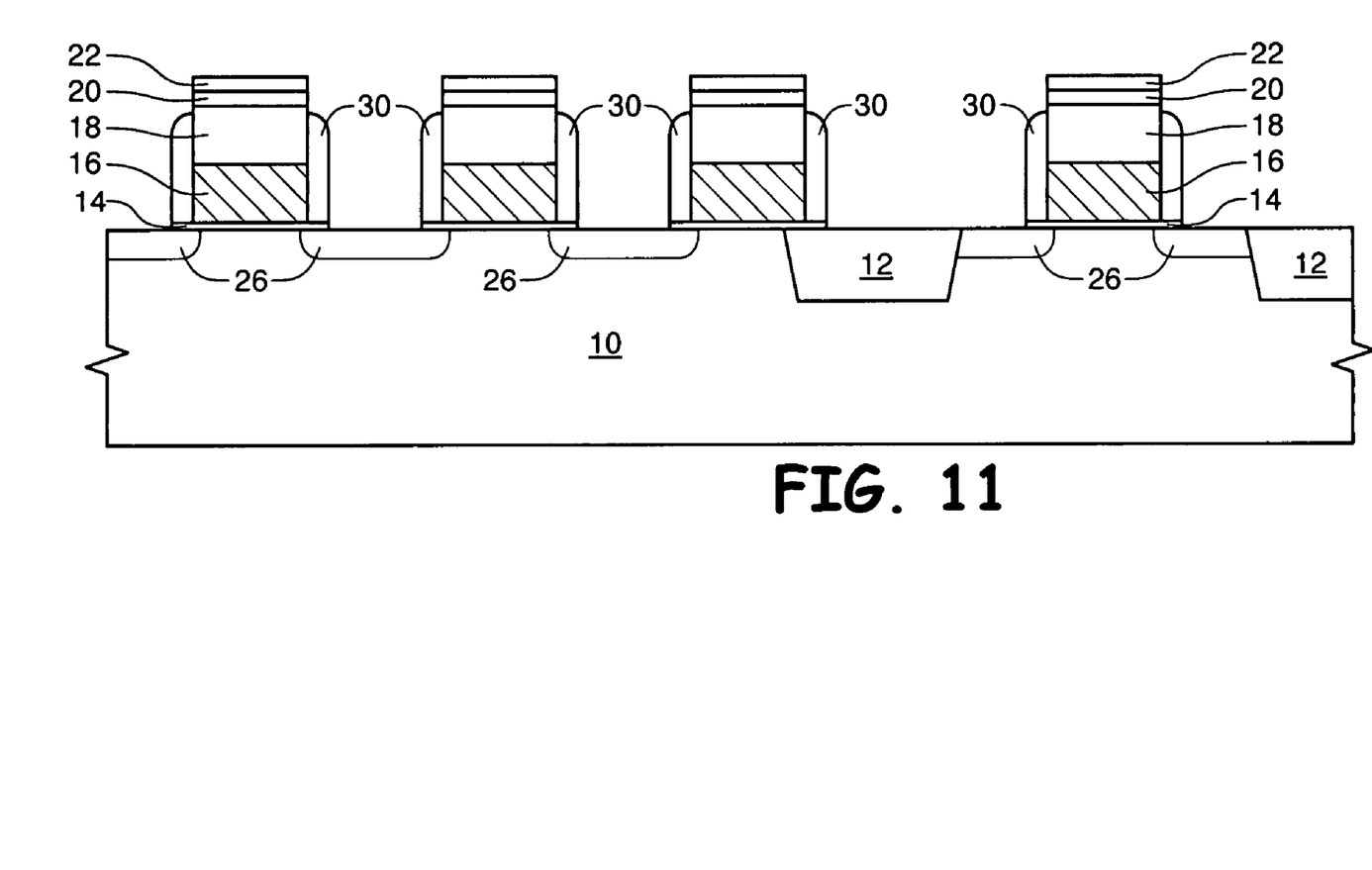
FIG. 11 is a cross section depicting an intermediate structure using a second embodiment of the present invention.

An intermediate structure of another embodiment is depicted by FIG. 11. The FIG. 11 structure is similar to the structure of FIG. 3, except that the TEOS buffer layer 18 of FIG. 3 is formed much thicker in the FIG. 11 structure. In FIG. 11, buffer layer 18 extends above the top of spacer 30, and nitride gate capping layer 20 is formed as a thinner layer than the FIG. 3 embodiment. An advantage of this embodiment is that during etching of the dielectric layers overlying polysilicon transistor gate layer 16, which occurs to the FIG. 5 structure, an etch which etches oxide selective to nitride spacer 30 may be used. This embodiment does not rely on a highly vertical etch for removal of nitride layer 20 selective to nitride spacer 30, but instead relies on the etch being selective to nitride spacer 30 relative to oxide layer 18. For example, a wet etch comprising the use of dilute hydrofluoric acid (HF) is highly selective to silicon nitride 30 and polysilicon 50, 16 when etching silicon dioxide 18.

Figure 12:
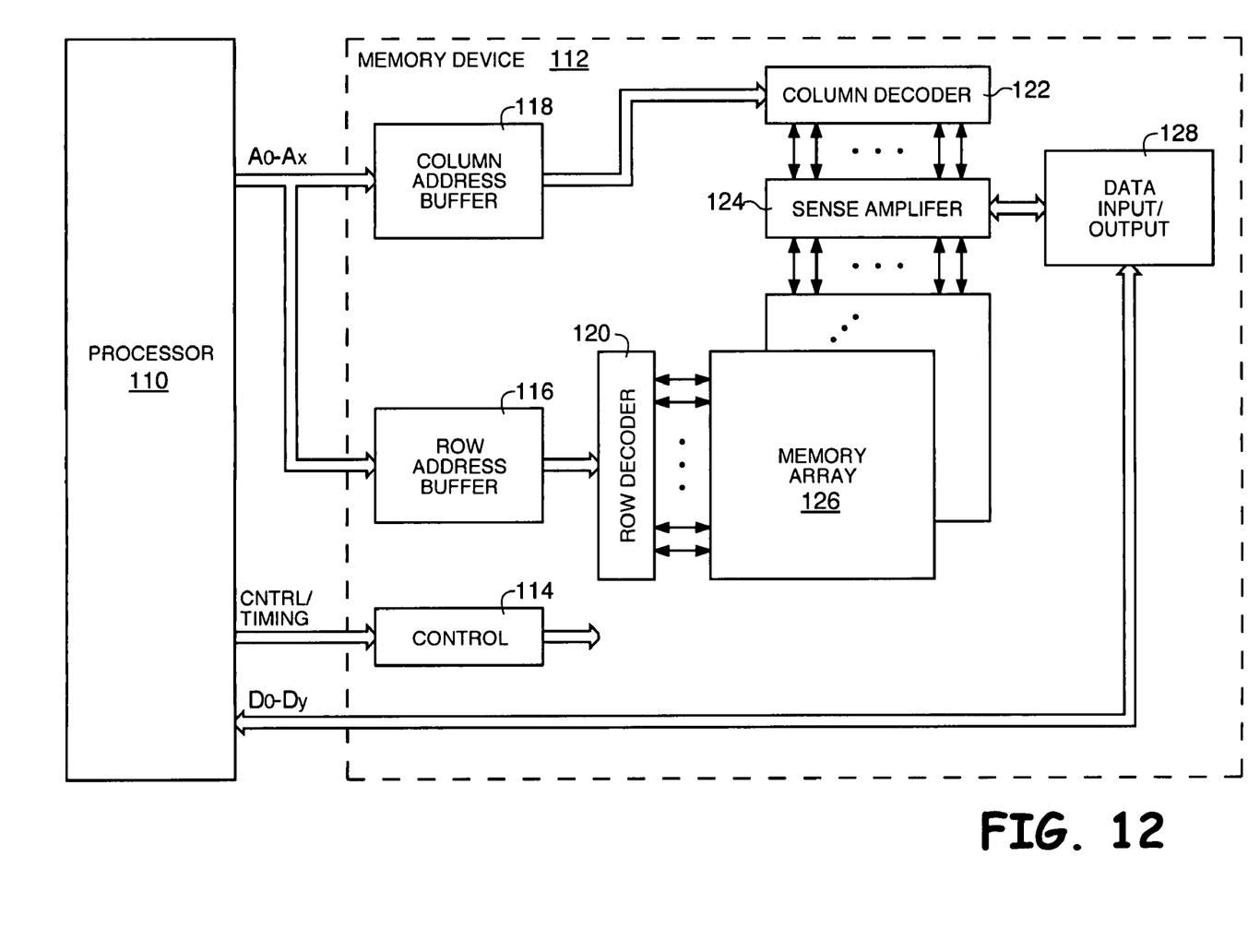
FIG. 12 is a block diagram of an exemplary use of the invention as a memory array in a dynamic random access memory.

The process and structure described herein may be used to manufacture a number of different structures which comprise a polysilicon transistor word line and/or a polysilicon plug. FIG. 12, for example, is a simplified block diagram of a memory device such as a dynamic random access memory having word lines and conductive plugs which may be formed using an embodiment of the present invention. The general operation of such a device is known to one skilled in the art. FIG. 12 depicts a processor 110 coupled to a memory device 112, and further depicts the following basic sections of a memory integrated circuit: control circuitry 114; row 116 and column 118 address buffers; row 120 and column 122 decoders; sense amplifiers 124; memory array 126; and data input/output 128.

Figure 13:
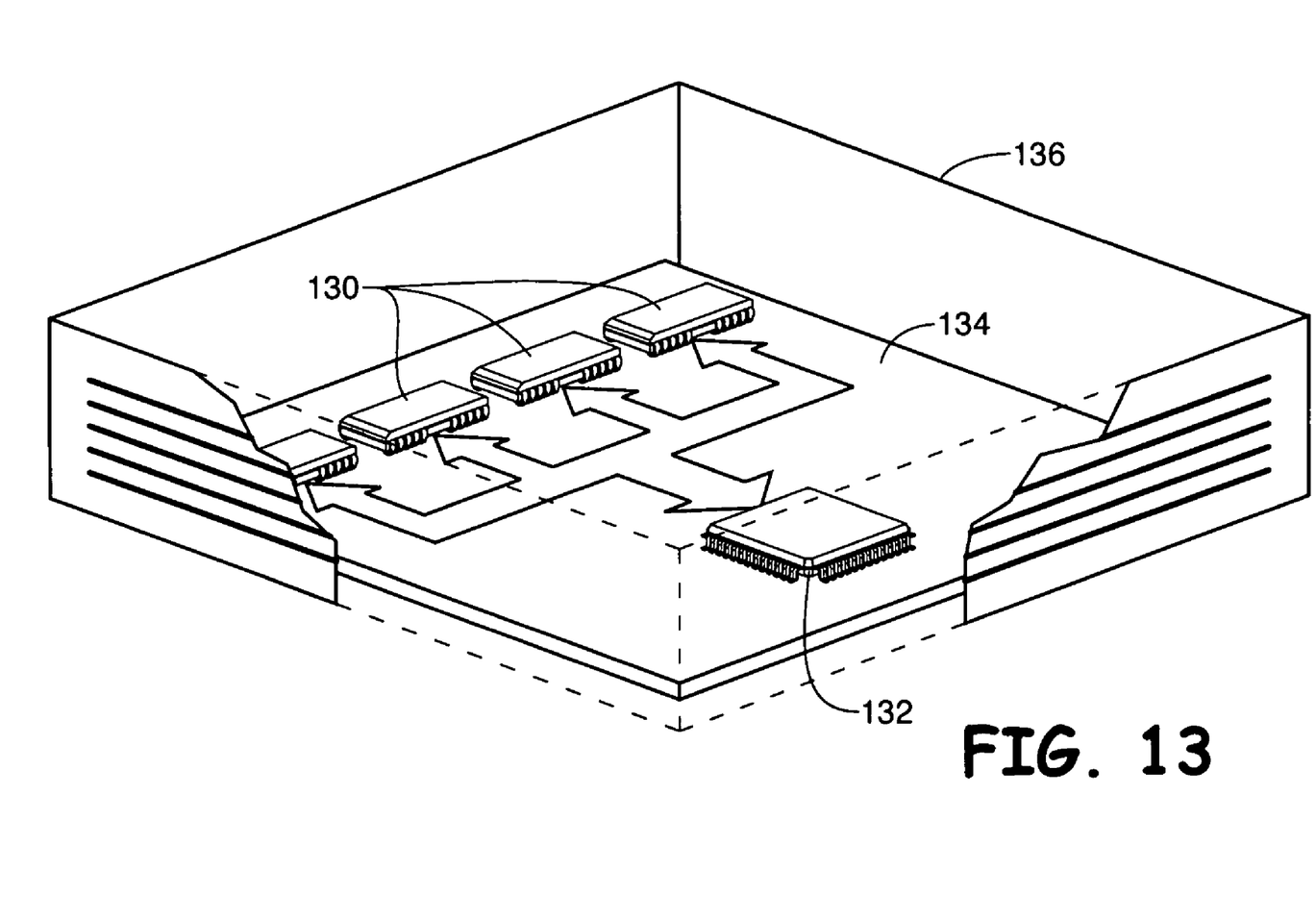
FIG. 13 is a schematic drawing depicting various exemplary uses of the invention.

As depicted in FIG. 13, a semiconductor device 130 formed in accordance with the invention may be attached along with other devices such as a microprocessor 132 to a printed circuit board 134, for example to a computer motherboard or as a part of a memory module used in a personal computer, a minicomputer, or a mainframe 136. FIG. 13 may also represent use of device 130 in other electronic devices comprising a housing 136, for example devices comprising a microprocessor 132, related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

The invention claimed is:

1. A semiconductor device comprising:
   a word line comprising first and second vertically oriented surfaces and a horizontally oriented surface;

first and second spacers, each spacer comprising a vertically oriented surface having a first portion which contacts the word line and a second portion;
a conductive plug comprising:
a first surface self-aligned to the vertically oriented surface of one of the spacers; and
a second surface which contacts the one spacer with which the first surface of the conductive plug is self-aligned; and a conductive material in direct contact with the first surface of the conductive plug.

2. The semiconductor device of claim 1, further comprising a dielectric layer overlying and contacting the word line and contacting the vertically oriented surface of each of the first and second spacers.

3. The semiconductor device of claim 1, wherein the conductive material comprises a metal.

4. The semiconductor device of claim 3, further comprising a protective material on the metal.

5. The semiconductor device of claim 4, wherein the protective material comprises a metal nitride.

6. The semiconductor device of claim 3, wherein the metal comprises one of cobalt, nickel, titanium and tungsten.

7. The semiconductor device of claim 1, wherein the conductive material comprises an enhancement layer.

8. The semiconductor device of claim 1, wherein the conductive material comprises a silicide.

9. The semiconductor device of claim 8, wherein the silicide comprises one of cobalt silicide and nickel silicide.

10. The semiconductor device of claim 1, wherein the conductive plugs comprise polysilicon plugs.

11. The semiconductor device of claim 10, wherein the polysilicon plugs are each in contact with a respective source/drain region.

12. The semiconductor device of claim 1, wherein the conductive material does not contact at least a portion of the vertically oriented surface of the first spacer.

13. A semiconductor device comprising:
first and second conductive plugs each having a horizontally oriented surface and first and second vertically oriented surfaces;
a conductive transistor control gate interposed between the first and second conductive plugs, the conductive transistor control gate having first and second vertically oriented surfaces and a horizontally oriented surface;
first and second dielectric spacers each having a top surface and first and second vertically oriented surfaces, wherein the first vertically oriented surface of the first dielectric spacer contacts the first vertically oriented surface of the conductive transistor control gate and is self-aligned to the first vertically oriented surface of the first conductive plug, wherein the first vertically oriented surface of the second dielectric spacer contacts the second vertically oriented surface of the conductive transistor control gate and is self-aligned to the first vertically oriented surface of the second conductive plug, wherein the second vertically oriented surface of the first dielectric spacer contacts the second vertically oriented surface of the first conductive plug, wherein the second vertically oriented surface of the second dielectric spacer contacts the second vertically oriented surface of the second conductive plug, and wherein the top surface of each spacer is above the horizontally oriented surface of the conductive transistor control gate; and
a conductive layer comprising:
a first portion which electrically contacts the horizontally oriented surface of the conductive transistor control gate;
a second portion which contacts the first vertically oriented surface of one of the first and second conductive plugs; and
a third portion which electrically contacts the horizontally oriented surface of one of the conductive plugs.

14. The semiconductor device of claim 13, wherein the conductive layer comprises one of a cobalt silicide and a nickel silicide.

15. A semiconductor device comprising:
first and second conductive plugs each having a horizontally oriented surface and a vertically oriented surface;
a conductive transistor control gate interposed between the first and second conductive plugs, the conductive transistor control gate having first and second vertically oriented surfaces and a horizontally oriented surface;
first and second dielectric spacers each having a top surface and first and second vertically oriented surfaces, wherein the first vertically oriented surface of the first and second dielectric spacers each contact a respective one of the first and second vertically oriented surfaces of the conductive transistor control gate, and the second vertically oriented surface of the first and second dielectric spacers each contact the vertically oriented surface of a respective one of the first and second conductive plugs, and the top surface of each spacer is above the horizontally oriented surface of the conductive transistor control gate; and
a conductive layer comprising:
a first portion which electrically contacts the horizontally oriented surface of the conductive transistor control gate;
a second portion which contacts the vertically oriented surface of one of the first and second conductive plugs; and
a third portion which electrically contacts the horizontally oriented surface of one of the conductive plugs,
wherein the semiconductor device is an in-process semiconductor device further comprising a dielectric layer different from the first and second spacers which contacts the first and second portions of the conductive layer, the first and second spacers, and which contacts neither the first and second plugs nor the transistor control gate.

16. A semiconductor device comprising:
first and second conductive plugs each having a horizontally oriented surface and a vertically oriented surface;
a conductive transistor control gate interposed between the first and second conductive plugs, the conductive transistor control gate having first and second vertically oriented surfaces and a horizontally oriented surface;
first and second dielectric spacers each having a top surface and first and second vertically oriented surfaces, wherein the first vertically oriented surface of the first and second dielectric spacers each contact a respective one of the first and second vertically oriented surfaces of the conductive transistor control gate, and the second vertically oriented surface of the first and second dielectric spacers each contact the vertically oriented surface of a respective one of the first and second conductive plugs, and the top surface of each spacer is above the horizontally oriented surface of the conductive transistor control gate; and
a conductive layer comprising:

a first portion which electrically contacts the horizontally oriented surface of the conductive transistor control gate:

a second portion which contacts the vertically oriented surface of one of the first and second conductive plugs; and a third portion which electrically contacts the horizontally oriented surface of one of the conductive plugs, further comprising a protective layer contacting the conductive layer, wherein the conductive layer comprises silicide and the protective layer comprises a metal nitride.

17. A semiconductor device, comprising: a conductive transistor gate having first and second vertically oriented sidewalls; a dielectric overlying the conductive transistor gate, wherein the dielectric comprises a horizontally oriented lower surface, a horizontally oriented upper surface, and first and second vertically oriented sidewalls; first and second spacers each comprising a vertically oriented sidewall and an upper extent, wherein: the vertically oriented sidewall of the first spacer contacts the first vertically oriented sidewall of the transistor gate and the first vertically oriented sidewall of the dielectric; and the vertically oriented sidewall of the second spacer contacts the second vertically oriented sidewall of the transistor gate and the second vertically oriented sidewall of the dielectric, wherein the upper extent of each spacer is at a level above the lower surface of the dielectric and below the upper surface of the dielectric; a conductive plug having a vertically oriented sidewall, the sidewall comprising first and second portions, wherein the first portion of the sidewall contacts the first spacer and wherein the second portion of the sidewall is self-aligned to the sidewall of the first spacer; and a conductive material directly contacting the conductive plug adjacent the level of the upper extent of the first spacer.

18. The semiconductor device of claim 17, wherein the conductive material comprises one of a cobalt silicide and a nickel silicide.

19. The semiconductor device of claim 17, wherein the conductive material further directly contacts a top surface of the conductive plug.

20. The semiconductor device of claim 19, wherein the vertically oriented sidewall of the first spacer further contacts the conductive material, wherein a portion of the vertically oriented sidewall of the first spacer that contacts the conductive material is between a portion of the vertically oriented sidewall of the first spacer that contacts the sidewall of the gate and a portion of the vertically oriented sidewall of the first spacer that contacts the dielectric.

* * * * *

UNITED STATES PATENT AND TRADEMARK OFFICE
CERTIFICATE OF CORRECTION

| | | |
|---|---|---|
| PATENT NO. | : 7,501,672 B2 | Page 1 of 1 |
| APPLICATION NO. | : 11/545163 | |
| DATED | : March 10, 2009 | |
| INVENTOR(S) | : Fishburn et al. | |

It is certified that error appears in the above-identified patent and that said Letters Patent is hereby corrected as shown below:

In column 7, line 62, in Claim 13, before "contacts" delete "spacer".

In column 8, line 4, in Claim 13, after "the" delete "first".

In column 9, line 3, in Claim 16, delete "gate:" and insert -- gate; --, therefore.

Signed and Sealed this

Thirtieth Day of June, 2009

JOHN DOLL
*Acting Director of the United States Patent and Trademark Office*